(12) United States Patent
Goeke

(10) Patent No.: US 7,834,641 B1
(45) Date of Patent: Nov. 16, 2010

(54) PHASE-GAIN CALIBRATION OF IMPEDANCE/ADMITTANCE METER

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 173 days.

(21) Appl. No.: 11/759,487

(22) Filed: Jun. 7, 2007

(51) Int. Cl.
*G01R 35/00* (2006.01)
(52) U.S. Cl. ...................................... 324/601
(58) Field of Classification Search .................. 324/601
See application file for complete search history.

(56) References Cited

U.S. PATENT DOCUMENTS 4,782,282 A * 11/1988 Bachman .................... 324/668
6,756,790 B2 * 6/2004 Yakabe et al. .............. 324/649
7,441,213 B2 * 10/2008 Lehner et al. .................. 716/5
2006/0036382 A1 * 2/2006 Paz et al. ...................... 702/76

OTHER PUBLICATIONS

Efficient Microwave Bias and Testing Using the HP 4142B Modular DC Source/Monitor. Hewlett Packard. Application Note 1205 (Date: At least as early as Aug. 30, 2006.).

* cited by examiner

*Primary Examiner*—Jeff Natalini
(74) *Attorney, Agent, or Firm*—Pearne & Gordon LLP

(57) ABSTRACT

A method for calibrating an impedance/admittance meter for measurements of a DUT includes measuring a pure capacitance at a desired frequency; using the capacitance measurement to establish the phase response of the meter; measuring the admittance value of a resistor with the meter at the desired frequency, the resistor having a known DC conductance and being known to primarily exhibit parallel capacitive frequency dependency; and adjusting the gain of the meter to provide the known DC conductance as the real component of the admittance value.

6 Claims, 1 Drawing Sheet

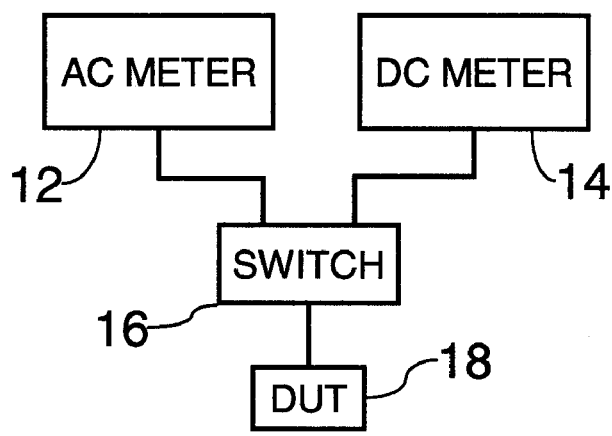
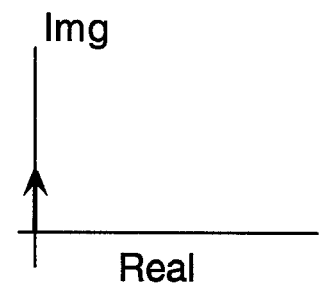
Fig. 1
Fig. 2
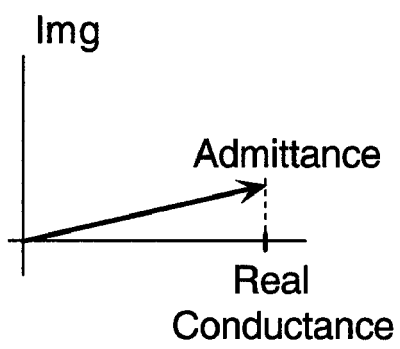
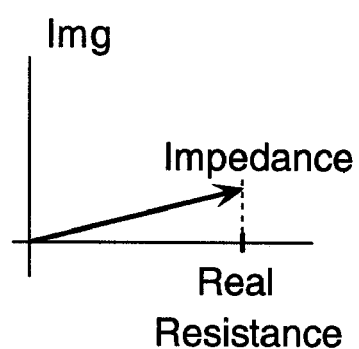
Fig. 3
Fig. 4

PHASE-GAIN CALIBRATION OF IMPEDANCE/ADMITTANCE METER

BACKGROUND OF THE INVENTION

The present invention relates to AC electrical measurements and, in particular, to the calibration of a measurement instrument.

Typically, AC measurement instruments (e.g., LCR meters) that measure parameters such as impedance and/or its inverse, admittance, have been calibrated by measuring known impedances at various calibration frequencies. This can be difficult, time-consuming and expensive, at least partly because building a pure resistor for a high frequency measurement is difficult. As the frequency increases, providing a pure resistance for calibration becomes more difficult.

SUMMARY OF THE INVENTION

A method for calibrating an impedance/admittance meter for measurements of a DUT includes measuring a pure capacitance at a desired frequency; using the capacitance measurement to establish the phase response of the meter; measuring the admittance value of a resistor with the meter at the desired frequency, the resistor having a known DC conductance and being known to primarily exhibit parallel capacitive frequency dependency; and adjusting the gain of the meter to provide the known DC conductance as the real component of the admittance value.

BRIEF DESCRIPTION OF THE DRAWINGS

FIG. 1 is a block diagram of an example of a measurement system that may be used with an aspect of the invention.

FIG. 2 is a graph of a measurement of a pure capacitance.

FIG. 3 is a graph of a measurement of the admittance of a resistance that exhibits parallel capacitance at a frequency of interest.

FIG. 4 is a graph of a measurement of the impedance of a resistance that exhibits serial inductance at a frequency of interest.

DESCRIPTION OF THE PREFERRED EMBODIMENTS

Referring to FIG. 1, an AC meter 12 and a DC meter 14 are connected through a selector switch 16 to a device under test (DUT) 18. The switch 16 selects whether AC or DC measurements are made on the DUT 18. The AC meter 12 can be used as an impedance/admittance meter.

"Pure" capacitances are relatively easy to achieve. However, a resistor that exhibits "pure" resistance over a wide frequency range is difficult to achieve (e.g., 100 Kohm to 10 MHz). Such high resistances tend to primarily exhibit undesirable parallel capacitance. Low resistances tend to primarily exhibit undesirable series inductance.

The admittance of a resistor with a resistance R and a parallel capacitance C can be expressed as:

$$Y(\omega) = 1/R + j\omega C,$$

1/R is the conductance of the resistor. The admittance is a complex number, the conductance is a real number and $j\omega C$ is imaginary. It should be noted that the conductance is not a function of the frequency.

Similarly, the impedance of a resistor with a resistance R and a series inductance L can be expressed as:

$$Z(\omega) = R + j\omega L.$$

The impedance is a complex number (which can also be expressed as a magnitude and a phase), the resistance is a real number and $j\omega L$ is imaginary. It should be noted that the resistance is not a function of the frequency.

Referring to FIG. 2, to calibrate the AC meter 12, a pure capacitor is measured with the AC meter 12 at a desired frequency. The actual magnitude is not critical. The phase response of the AC meter 12 is adjusted to provide the expected −90 degree phase of the pure capacitance.

Referring to FIG. 3, for a resistor with a known DC conductance and primarily exhibiting parallel capacitive frequency dependency, the admittance of the resistor is measured with the AC meter 12 at the desired frequency. The gain of the AC meter 12 is then adjusted to so that the real component of the admittance (which, as noted above, is not frequency dependent) is equal to the known DC conductance of the resistor. As a result, the AC meter 12 has been calibrated for measuring impedances at the desired frequency.

Referring to FIG. 4, if the resistor is instead known to primarily exhibit series inductive frequency dependency, the impedance of the resistor is measured with the AC meter 12 at the desired frequency. The gain of the AC meter 12 is then adjusted so that the real component of the impedance (which, as noted above, is not frequency dependent) is equal to the known DC resistance of the resistor. As a result, the AC meter 12 has been calibrated for measuring impedances at the desired frequency.

The DUT 18 itself can be used to provide the calibration resistor. For example, an element in the DUT 18 such as an electrical trace may be used as the calibration resistor. The DC meter 14 can then be used to measure the resistance/conductance of the resistor for use in the calibration process for the AC meter 12.

It is also possible that the DUT 18 contains a electrical structure suitable for the capacitor for use in calibrating the AC meter 12.

It should be further noted that the terms impedance or admittance and resistance or conductance have been selected to aid in understanding the invention by simplifying the mathematical considerations. It is within the scope of the invention to use the equivalent inverse parameters and perform the necessary additional mathematics to obtain the equivalent results.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for calibrating an impedance/admittance meter for measurements of a DUT, said method comprising:
    measuring a pure capacitance at a desired frequency;
    using said capacitance measurement to establish the phase response of the meter;
    measuring the admittance value of a resistor with said meter at said desired frequency, said resistor having a known DC conductance and being known to primarily exhibit parallel capacitive frequency dependence; and
    adjusting the gain of said meter to provide said known DC conductance as the real component of said admittance value.

2. A method according to claim 1, wherein said resistor is an electrical trace on said DUT, said known DC conductance being obtained by a DC measurement on said DUT.

3. A method according to claim 2, wherein said pure capacitance is an electrical structure on said DUT.

4. A method for calibrating an impedance/admittance meter for measurements of a DUT, said method comprising:
   measuring a pure capacitance at a desired frequency;
   using said capacitance measurement to establish the phase response of the meter;
   measuring the impedance value of a resistor with said meter at said desired frequency, said resistor having a known DC resistance and being known to primarily exhibit series inductive frequency dependency; and
   adjusting the gain of said meter to provide said known DC resistance as the real component of said impedance value.

5. A method according to claim 4, wherein said resistor is an electrical trace on said DUT, said known DC resistance being obtained by a DC measurement on said DUT.

6. A method according to claim 5, wherein said pure capacitance is an electrical structure on said DUT.

* * * * *